US009429252B2

(12) United States Patent
Larsen et al.

(10) Patent No.: US 9,429,252 B2
(45) Date of Patent: Aug. 30, 2016

(54) CABLE TROUGH

(71) Applicant: Ortronics, Inc., New London, CT (US)

(72) Inventors: Lars R. Larsen, Old Lyme, CT (US); Chris M. Vacca, Westerly, RI (US)

(73) Assignee: Ortronics, Inc., New London, CT (US)

( * ) Notice: Subject to any disclaimer, the term of this patent is extended or adjusted under 35 U.S.C. 154(b) by 167 days.

(21) Appl. No.: 14/304,079

(22) Filed: Jun. 13, 2014

(65) Prior Publication Data

US 2015/0366100 A1   Dec. 17, 2015

(51) Int. Cl.
*E04G 5/06* (2006.01)
*F16L 3/23* (2006.01)
*H05K 7/14* (2006.01)

(52) U.S. Cl.
CPC ............. *F16L 3/23* (2013.01); *H05K 7/1491* (2013.01)

(58) Field of Classification Search
CPC ........ H05K 7/14; H05K 5/0247; H05K 7/18; F16L 3/26; H04Q 1/06; H04Q 1/062; H04Q 1/064; H04Q 1/066; H04Q 1/068
USPC .......................... 248/71, 68.1, 231.9, 220.31; 385/134–135, 826
See application file for complete search history.

(56) References Cited

U.S. PATENT DOCUMENTS

| 5,559,922 | A * | 9/1996 | Arnett ................... G02B 6/4452 385/135 |
| 6,415,091 | B1 * | 7/2002 | Daub .................... G02B 6/4452 385/135 |
| 6,968,647 | B2 | 11/2005 | Levesque et al. |
| 7,225,586 | B2 | 6/2007 | Levesque et al. |
| 7,983,038 | B2 | 7/2011 | Levesque et al. |
| 8,106,311 | B2 | 1/2012 | Larsen et al. |
| 8,130,494 | B2 | 3/2012 | Larsen et al. |
| 8,526,181 | B2 | 9/2013 | Levesque et al. |
| 8,731,364 | B2 | 5/2014 | Murano et al. |
| 2006/0171651 | A1 * | 8/2006 | Laursen .................. H04Q 1/064 385/135 |
| 2007/0189693 | A1 * | 8/2007 | Smrha .................. G02B 6/4452 385/135 |
| 2008/0050085 | A1 * | 2/2008 | Tinucci ................ G02B 6/4471 385/135 |
| 2009/0129014 | A1 | 5/2009 | Larsen et al. |
| 2011/0020091 | A1 * | 1/2011 | Larsen .................... F16B 27/00 411/84 |
| 2012/0234778 | A1 * | 9/2012 | Anderson ............ G02B 6/4452 211/26.2 |
| 2014/0206273 | A1 | 7/2014 | Larsen et al. |

OTHER PUBLICATIONS

U.S. Appl. No. 14/163,552, filed Jan. 24, 2014.

* cited by examiner

*Primary Examiner* — Christopher E Garft
(74) *Attorney, Agent, or Firm* — McCarter & English, LLP

(57) ABSTRACT

Improved cable troughs and related methods of use are provided. The present disclosure provides improved cable troughs configured to support media cables, and related methods of use. More particularly, the present disclosure provides advantageous systems/methods for the design and use of cable troughs configured to support media cables associated with a rack or the like. Disclosed herein is an advantageous cable trough having front and rear walls extending from a bottom wall, with the front, rear and bottom walls defining a channel that is configured and dimensioned to support and/or at least partially house media cables or the like. The exemplary cable trough includes attachment features/structures that are advantageously configured and dimensioned to releasably mount with respect to a supporting structure. Moreover, the attachment features/structures of the cable trough allow the cable trough to be releasably mounted at various angled positions relative to the supporting structure.

22 Claims, 14 Drawing Sheets

CABLE TROUGH

BACKGROUND

1. Technical Field

The present disclosure relates to cable troughs configured to support media cables and, more particularly to the design and use of cable troughs configured to support media cables associated with a rack or the like.

2. Background Art

In general, many data transfer media includes multiple lines/fibers bundled together. Communications systems typically incorporate such media (e.g., unshielded twisted pair cables/media, fiber optic cables, etc.) for data transfer. In general, commercial buildings require an effective and efficient telecommunications infrastructure to support the wide variety of services that rely on the transport of information. Typically, wiring/cabling systems within buildings are terminated at a location where they may be interconnected with one another, and/or to other cabling systems or telecommunications equipment. Cables are often terminated on wire panels or patch panels or the like, which can be mounted to racks or to some other location/structure.

Many rows of cabinets or racks typically fill a data center or telecommunications room. In general, many of the cables associated with such cabinets/racks need to travel from the front of the cabinets/racks to the rear of the cabinets/racks. Many of these cables travel between adjacent racks from the front of the racks to the rear of the racks, and such cables may be unsupported and/or insufficiently supported during this travel from the front to the rear of the racks.

Some exemplary assemblies/systems in this general field are described and disclosed in U.S. Pat. Nos. 7,983,038; 8,106,311; 8,130,494; 8,526,181 and 8,731,364, and U.S. Patent Pub. No. 2009/0129014, and U.S. patent application Ser. Nos. 14/163,552 and 14/221,835, the entire contents of each being hereby incorporated by reference in their entireties. A constant need exists among manufacturers to develop racks or associated devices or the like having improved supporting features/structures to support media cables associated with the racks. Thus, an interest exists for improved structures/features configured to support media cables, and related methods of use. These and other inefficiencies and opportunities for improvement are addressed and/or overcome by the assemblies, systems and methods of the present disclosure.

SUMMARY

The present disclosure provides advantageous cable troughs, and improved methods/systems for using the same. The present disclosure provides advantageous cable troughs configured to support media cables, and related methods of use. More particularly, the present disclosure provides improved systems/methods for the design and use of cable troughs configured to support media cables associated with a rack or the like.

In exemplary embodiments, disclosed herein is an advantageous cable trough having front and rear walls extending from a bottom wall, with the front, rear and bottom walls defining a channel that is configured and dimensioned to support and/or at least partially house media cables or the like. The exemplary cable trough includes attachment features/structures (e.g., an attachment flange and/or attachment members) that are advantageously configured and dimensioned to releasably mount with respect to a supporting structure (e.g., rack) or the like (e.g., relative to vent holes of a rack). Moreover, the attachment features/structures of the cable trough allow the cable trough to be releasably mounted at various angled positions relative to the supporting structure, as selected by a user.

The present disclosure provides for a cable trough including a bottom wall; a front wall extending from the bottom wall and a rear wall extending from the bottom wall, the front, rear and bottom walls defining a channel configured to support and at least partially house media cables; an attachment flange extending from the rear wall, the attachment flange including: (i) a first attachment member extending from a first flange wall of the attachment flange, and (ii) a second attachment member extending from a second flange wall of the attachment flange; wherein the first and second flange walls are proximal to one another and angled at a first pre-determined angle relative to one another; wherein the first and second attachment members are proximal to one another and angled at the first pre-determined angle relative to one another; wherein the first attachment member is configured to releasably mount with respect to an edge of an aperture of a supporting structure when the attachment flange is in a first angled position relative to the supporting structure; and wherein the second attachment member is configured to releasably mount with respect to the edge of the aperture of the supporting structure when the attachment flange is in a second angled position relative to the supporting structure.

The present disclosure also provides for a cable trough wherein the second attachment member is unable to mount to the edge of the aperture of the supporting structure when the attachment flange is in the first angled position relative to the supporting structure; and wherein the first attachment member is unable to mount to the edge of the aperture of the supporting structure when the attachment flange is in the second angled position relative to the supporting structure.

The present disclosure also provides for a cable trough wherein the channel is substantially U-shaped. The present disclosure also provides for a cable trough wherein the supporting structure is a rack.

The present disclosure also provides for a cable trough further including a third attachment member extending from a third flange wall of the attachment flange, and a fourth attachment member extending from a fourth flange wall of the attachment flange; and wherein the third and fourth flange walls are proximal to one another and angled at a second pre-determined angle relative to one another; wherein the third and fourth attachment members are proximal to one another and angled at the second pre-determined angle relative to one another; wherein the first and third attachment members are configured to releasably mount with respect to the edge of the aperture of the supporting structure when the attachment flange is in the first angled position relative to the supporting structure; and wherein the second and fourth attachment members are configured to releasably mount with respect to the edge of the aperture of the supporting structure when the attachment flange is in the second angled position relative to the supporting structure.

The present disclosure also provides for a cable trough wherein the second and fourth attachment members are unable to mount to the edge of the aperture of the supporting structure when the attachment flange is in the first angled position relative to the supporting structure; and wherein the first and third attachment members are unable to mount to the edge of the aperture of the supporting structure when the attachment flange is in the second angled position relative to the supporting structure.

The present disclosure also provides for a cable trough further including a fifth attachment member extending from a fifth flange wall of the attachment flange, and a six attachment member extending from a sixth flange wall of the attachment flange; and wherein the fifth and sixth flange walls are proximal to one another and angled at a third pre-determined angle relative to one another; wherein the fifth and sixth attachment members are proximal to one another and angled at the third pre-determined angle relative to one another; wherein the first, third and fifth attachment members are configured to releasably mount with respect to the edge of the aperture of the supporting structure when the attachment flange is in the first angled position relative to the supporting structure; and wherein the second, fourth and sixth attachment members are configured to releasably mount with respect to the edge of the aperture of the supporting structure when the attachment flange is in the second angled position relative to the supporting structure.

The present disclosure also provides for a cable trough wherein the second, fourth and sixth attachment members are unable to mount to the edge of the aperture of the supporting structure when the attachment flange is in the first angled position relative to the supporting structure; and wherein the first, third and fifth attachment members are unable to mount to the edge of the aperture of the supporting structure when the attachment flange is in the second angled position relative to the supporting structure.

The present disclosure also provides for a cable trough wherein the first pre-determined angle is about 150°. The present disclosure also provides for a cable trough wherein the first, second and third pre-determined angles are each about 150°.

The present disclosure also provides for a cable trough wherein the aperture of the supporting structure has a substantially polygonal shape. The present disclosure also provides for a cable trough wherein the aperture of the supporting structure has a substantially hexagonal shape.

The present disclosure also provides for a cable trough wherein the first and second attachment members each include an extending portion and a securing portion. The present disclosure also provides for a cable trough wherein the rear wall includes a hole therethrough, the hole configured to substantially match up with and align with the aperture when the attachment flange is in the first or second angled position relative to the supporting structure.

The present disclosure also provides for a cable trough wherein the front, rear and bottom walls each include one or more mounting slots, each mounting slot configured to mount with respect to a cable raceway.

The present disclosure also provides for a cable trough wherein the front and rear walls are substantially parallel to one another. The present disclosure also provides for a cable trough wherein the first pre-determined angle is from about 90° to about 175°. The present disclosure also provides for a cable trough wherein the first, second and third pre-determined angles are each from about 90° to about 175°.

The present disclosure also provides for a cable trough including a bottom wall; a front wall extending from the bottom wall and a rear wall extending from the bottom wall, the front, rear and bottom walls defining a substantially U-shaped channel configured to support and at least partially house media cables; an attachment flange extending from the rear wall, the attachment flange including: (i) a first attachment member extending from a first flange wall of the attachment flange, and (ii) a second attachment member extending from a second flange wall of the attachment flange; wherein the first and second flange walls are adjacent to one another and angled at a pre-determined angle relative to one another; wherein the first and second attachment members are adjacent to one another and angled at the pre-determined angle relative to one another; wherein the first attachment member is configured to releasably mount with respect to an edge of an aperture of a rack when the attachment flange is in a first angled position relative to the rack; wherein the second attachment member is configured to releasably mount with respect to the edge of the aperture of the rack when the attachment flange is in a second angled position relative to the rack; wherein the second attachment member is unable to mount to the edge of the aperture of the rack when the attachment flange is in the first angled position relative to the rack; and wherein the first attachment member is unable to mount to the edge of the aperture of the rack when the attachment flange is in the second angled position relative to the rack.

The present disclosure also provides for a cable trough system including a first cable trough having: (i) a bottom wall, a front wall extending from the bottom wall, and a rear wall extending from the bottom wall, with the front, rear and bottom walls defining a channel configured to support and at least partially house media cables, and (ii) means for releasably mounting the first cable trough to a first polygonal aperture of a supporting structure at different angled positions relative to the supporting structure.

The present disclosure also provides for a cable trough system further including a supporting structure; and a second cable trough having: (i) a bottom wall, a front wall extending from the bottom wall, and a rear wall extending from the bottom wall, with the front, rear and bottom walls defining a channel configured to support and at least partially house media cables, and (ii) means for releasably mounting the second cable trough to a second polygonal aperture of the supporting structure at different angled positions relative to the supporting structure.

The present disclosure also provides for a cable trough system wherein the supporting structure includes a side panel, the side panel including the first and second polygonal apertures; wherein the first cable trough is mounted with respect to the first polygonal aperture at a first angled position relative to the side panel; wherein the second cable trough is mounted with respect to the second polygonal aperture at a second angled position relative to the side panel.

The present disclosure also provides for a cable trough system wherein the first and second angled positions are angled at different angles relative to the side panel.

Any combination or permutation of embodiments is envisioned. Additional advantageous features, functions and applications of the disclosed systems, methods and assemblies of the present disclosure will be apparent from the description which follows, particularly when read in conjunction with the appended figures. All references listed in this disclosure are hereby incorporated by reference in their entireties.

BRIEF DESCRIPTION OF THE DRAWINGS

Features and aspects of embodiments are described below with reference to the accompanying drawings, in which elements are not necessarily depicted to scale.

Exemplary embodiments of the present disclosure are further described with reference to the appended figures. It is to be noted that the various steps, features and combinations of steps/features described below and illustrated in the figures can be arranged and organized differently to result in embodiments which are still within the scope of the present disclosure. To assist those of ordinary skill in the art in making and using the disclosed assemblies, systems and methods, reference is made to the appended figures, wherein.

DETAILED DESCRIPTION

Figure 1:
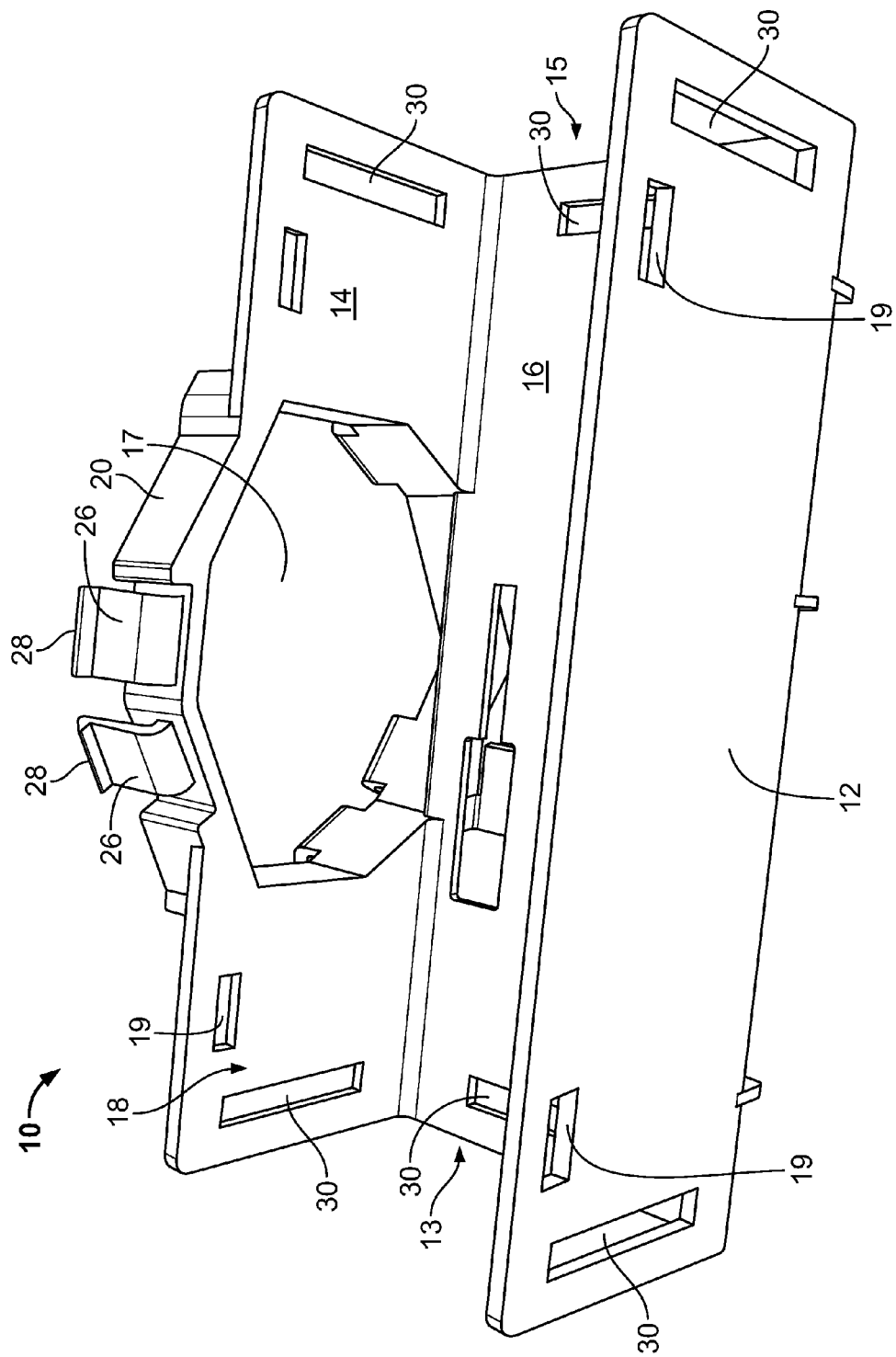
FIG. 1 is a front perspective view of an exemplary cable trough of the present disclosure.

The exemplary embodiments disclosed herein are illustrative of advantageous cable troughs, and systems of the present disclosure and methods/techniques thereof. It should be understood, however, that the disclosed embodiments are merely exemplary of the present disclosure, which may be embodied in various forms. Therefore, details disclosed herein with reference to exemplary cable troughs/fabrication methods and associated processes/techniques of assembly and use are not to be interpreted as limiting, but merely as the basis for teaching one skilled in the art how to make and use the advantageous cable troughs/systems and/or alternative assemblies of the present disclosure.

In general, the present disclosure provides improved cable troughs, and related methods of use. The present disclosure provides improved cable troughs configured to support media cables, and related methods of use. More particularly, the present disclosure provides advantageous systems/methods for the design and use of cable troughs configured to support media cables associated with a rack or the like.

In exemplary embodiments, the present disclosure provides for an advantageous cable trough having front and rear walls extending from a bottom wall, with the front, rear and bottom walls defining a channel (e.g., U-shaped channel or the like) that is configured and dimensioned to support and/or at least partially house media cables or the like. The exemplary cable trough includes an attachment flange and/or attachment members that are advantageously configured and dimensioned to releasably mount with respect to a supporting structure (e.g., rack) or the like (e.g., relative to vent holes of a rack). Moreover, the attachment features/structures of the cable trough allow the cable trough to be releasably mounted at various angled positions relative to the supporting structure, as desired by a user.

Current practice provides that many media cables associated with racks or the like travel between adjacent racks from the front of the racks to the rear of the racks, and such cables may be unsupported and/or insufficiently supported during this travel from the front to the rear of the racks. In exemplary embodiments, the present disclosure provides for improved systems/methods for the design and use of advantageous cable troughs configured to support media cables associated with a rack or the like, thereby providing a significant operational, commercial and/or manufacturing advantage as a result.

Referring now to the drawings, like parts are marked throughout the specification and drawings with the same reference numerals, respectively. Drawing figures are not necessarily to scale and in certain views, parts may have been exaggerated for purposes of clarity.

With reference to FIGS. 1 and 2-21, there is illustrated an embodiment of an exemplary cable trough 10 according to the present disclosure. In general, cable trough 10 is configured and dimensioned to support media cables 11 or the like (e.g., unshielded twisted pair cables/media, fiber optic cables, etc.). In exemplary embodiments and as discussed further below, cable trough 10 is configured to support media cables 11 associated with a rack 400 or the like (FIGS. 2 and 16-21).

It is noted that exemplary cable troughs 10 are adapted for use in conjunction with a rack 400 (e.g., network or server rack) or the like, although the present disclosure is not limited thereto. Rather, the disclosed cable troughs 10 are adapted for use in conjunction with other structures, such as, for example, frames, cabinets, patch panels, enclosures, supporting structures, or other structures that stand to benefit from proximate cable management functionality. For ease of disclosure, the potential structures to which the disclosed troughs 10 may be detachably mounted are collective referred to as "rack(s)." However, it is to be understood that the present disclosure is not limited by or to implementations wherein the disclosed troughs 10 are mounted with respect to, or used in conjunction with, a rack, but may be mounted with respect to, or used in conjunction with any structure/unit that is in proximity to or otherwise associated with cable routing.

Figure 2:
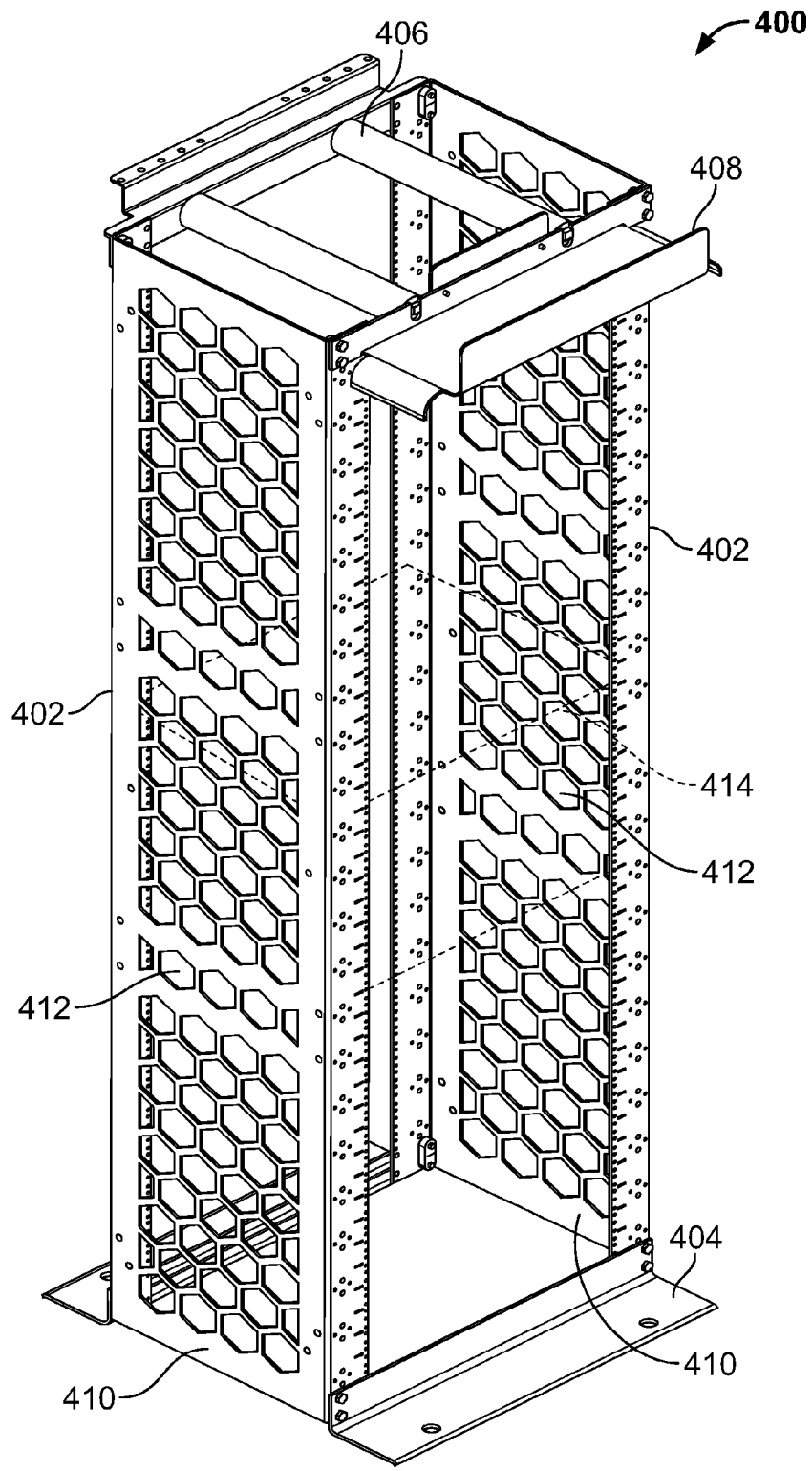
FIG. 2 is a perspective side view of an exemplary rack having ventilated side panels in accordance with embodiments of the present disclosure.
Figure 3:
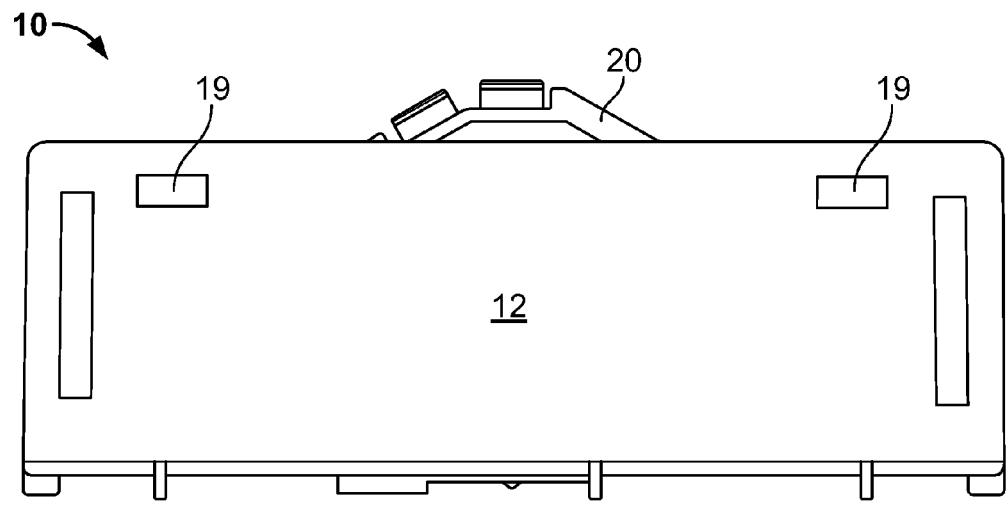
FIG. 3 is a front view of the cable trough of FIG. 1.
Figure 4:
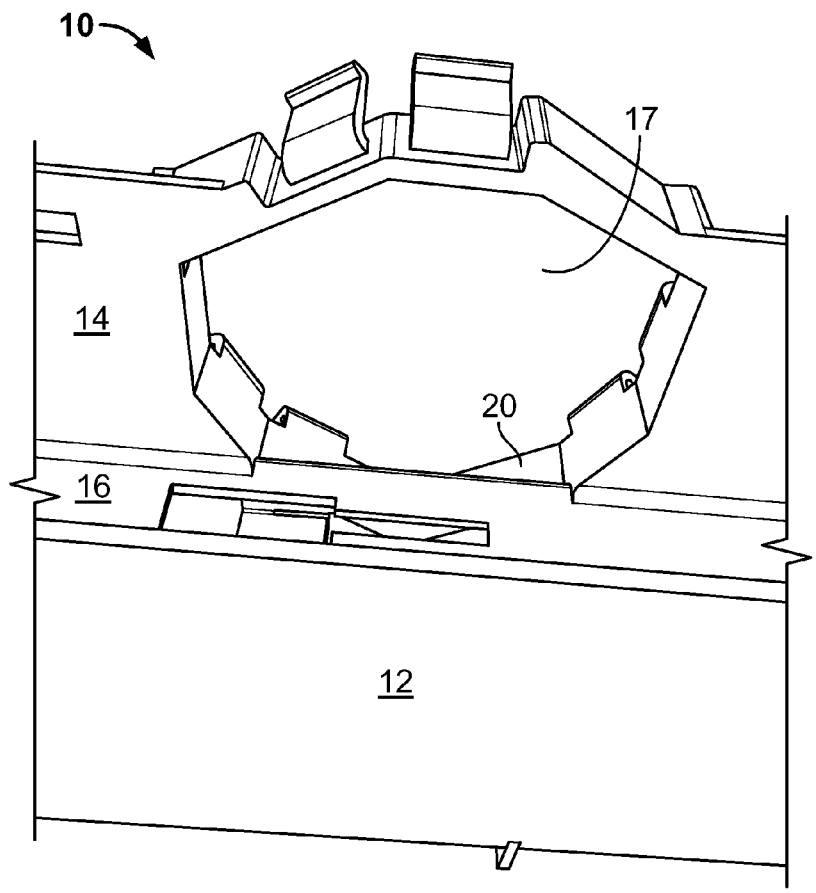
FIG. 4 is a partial front perspective view of the cable trough of FIG. 1.
Figure 5:
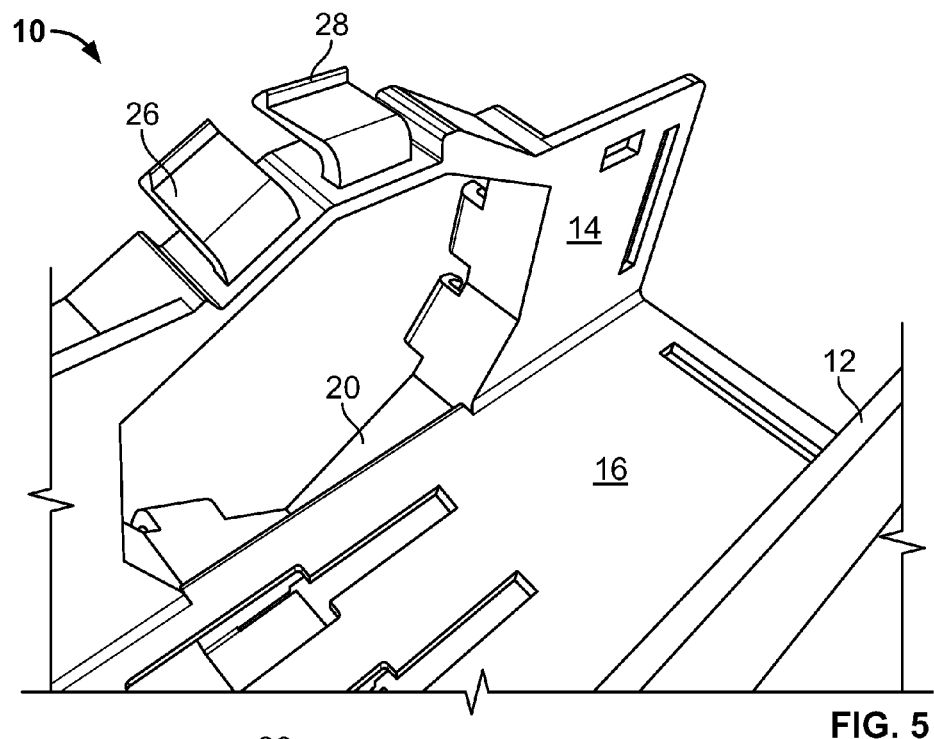
FIG. 5 is a partial top perspective view of the cable trough of FIG. 1.

As shown in FIG. 2, an exemplary rack 400 is depicted. In certain embodiments, rack 400 defines a rectangular frame, and can include two or more upright members 402. The upright members 402 can be attached to a base 404 at a bottom margin of the frame. The upright members 402 may further be attached to a top member 406. The top member 406 may include a waterfall 408 for facilitating the formation of appropriately large bend radii in cables mounted with respect to the rack 400.

Each of the upright members 402 may include side panel 410. Each side panel 410 may include a plurality of vent holes/apertures 412 for facilitating the passage of air through the side panel 410. For example, rack 400 is operable as a component of a ventilation system for delivering an improved flow of cooling air to one or more heat generating devices (one of which is shown schematically in FIG. 2 at reference numeral 414) mounted in the rack 400 through the vent holes 412 of a side panel 410, and/or to promote an effective flow of warm exhaust air through the vent holes 412 of a side panel 410.

In exemplary embodiments, the plurality of vent apertures 412 can extend across a predominant portion of the surface area of the side panel 410 to allow the side panel 410 to offer a relatively low level of resistance to the passage of air through the side panel 410 so that the rack 400 is able to deliver an effective flow of cooling air to the device 414 through the vent apertures 412 of a side panel 410, and/or to eliminate an effective flow of exhaust air from the device 414 through the vent apertures 412 of a side panel 410.

As shown in FIG. 2, exemplary vent apertures 412 can take the form of one or more regular or irregular arrays and collectively representing a predominant portion of the total area of the side panel 410 of the respective upright 402. It is noted that other arrangements of vent apertures 412 are possible.

In exemplary embodiments and as shown in FIG. 2, the vent apertures 412 can form one or more honeycomb-type arrays of polygonal (e.g., hexagonal) perforations through the side panel 410. For example, the respective shapes of the array and the individual perforations can be beneficial for purposes of achieving relatively high structural rigidity while simultaneously permitting a relatively high proportion of the area covered by the respective arrays to be open to the unhindered passage through the side panel 210 of respective flows of cooling and/or warm exhaust air with respect to the device 414 mounted therein.

It is noted that other shapes than a honeycomb shape may be provided for the array of vent apertures 412, and/or other shapes than a hexagonal shape may be provided for the vent apertures 412 themselves. For example, the vent apertures 412 may be arranged in an regular array of columns and rows (e.g., vertical columns and horizontal rows), and/or the vent holes themselves may define other shapes (e.g., polygonal shapes such as tetragons, pentagons, heptagons, octagons, etc., and/or regular or irregular shapes, circles, rhombi, etc., or combinations thereof).

In general, each aperture 412 is defined by edges 420 of side panel 410. For example, each fully hexagonally-shaped aperture 412 is defined by six edges 420 of side panel 410 (FIG. 2). It is again noted that apertures 412 can take of variety of shapes (e.g., polygonal shapes) and/or geometries, and therefore can be defined by a variety of different numbers of edges 420.

As discussed further below, exemplary cable troughs 10 of the present disclosure are advantageously configured and dimensioned to be mounted with respect to a vent aperture 412 of rack 400 (e.g., for cable management purposes). For example, the exemplary cable troughs 10 include attachment features/structures (e.g., an attachment flange 20 and/or attachment members 22) that are advantageously configured and dimensioned to releasably mount with respect to a user-selected aperture 412 of rack 400 (e.g., a user can mount cable trough 10 to one of a variety of different apertures 412 for differing mounting locations of cable trough 10 to rack 400). Moreover, the attachment features/structures of the exemplary cable trough 10 allow the cable trough 10 to be releasably mounted at various angled positions relative to the rack 400 (and to aperture 412), as selected by a user.

Turning again to cable trough 10 configured to support media cables 11 (FIG. 16) associated with rack 400, exemplary cable trough 10 includes a front wall 12, a rear wall 14 and a bottom wall 16. In exemplary embodiments, cable trough 10 is fabricated from plastic or a polymeric material or the like, although the present disclosure is not limited thereto. Rather, it is noted that cable trough 10 can be fabricated from a variety of materials, and can take a variety of shapes, forms or geometries. Rear wall 14 may or may not include a hole 17 therethrough, as discussed further below. Front and/or rear walls 12, 14 can include one or more mounting holes 19 for mounting/housing a cover member or tie wrap or the like thereto.

Exemplary front and rear walls 12, 14 extend up from bottom wall 16 at about a 90° angle relative to bottom wall 16 to form/define cable trough 10. It is noted that front and rear walls 12, 14 can extend from bottom wall 16 at other suitable angles to form/define cable trough 10. In certain embodiments, front and rear walls 12, 14 are substantially parallel to one another, although the present disclosure is not limited thereto.

In exemplary embodiments, front wall 12 extends from a first end 13 of bottom wall 16 to a second end 15 of bottom wall 16. However, it is noted that front wall 12 can extend any distance along bottom wall 16 to form/define cable trough 10. Likewise, exemplary rear wall 14 extends from first end 13 of bottom wall 16 to second end 15 of bottom wall 16. It is noted that rear wall 14 can extend any distance along bottom wall 16 to form/define cable trough 10.

In general, exemplary cable trough 10 includes front and rear walls 12, 14 extending from the bottom wall 16, with the front, rear and bottom walls 12, 14, 16 defining a channel 18 (e.g., U-shaped channel 18 or the like) that is configured and dimensioned to support and/or at least partially house media cables 11 (FIG. 16) or the like.

In exemplary embodiments and as shown in FIGS. 1 and 3-15, the cable trough 10 includes an attachment flange 20. Exemplary attachment flange 20 extends from rear wall 14, although the present disclosure is not limited thereto. Rather, attachment flange 20 can extend from other locations/positions from cable trough 10 (e.g., from front wall 12). As discussed further below, attachment flange 20 includes one or more attachment members 22 extending therefrom.

As noted, attachment flange 20 and attachment members 22 are advantageously configured and dimensioned to releasably mount with respect to a user-selected aperture 412 of rack 400. Exemplary attachment flange 20 and attachment members 22 allow the cable trough 10 to be releasably mounted at various angled positions relative to the rack 400, and relative to aperture 412, as selected by a user. As discussed below, cable trough 10 can be mounted with respect to the exterior surface or to the interior surface of side panel 410 of rack 400.

In certain embodiments, attachment flange 20 includes a plurality of flange walls 24, with the plurality of flange walls 24 defining attachment flange 20. Each attachment member 22 of attachment flange 20 typically extends from a different flange wall 24, although the present disclosure is not limited thereto. Rather, it is noted that more than one attachment member 22 can extend from each flange wall 24.

Figure 16:
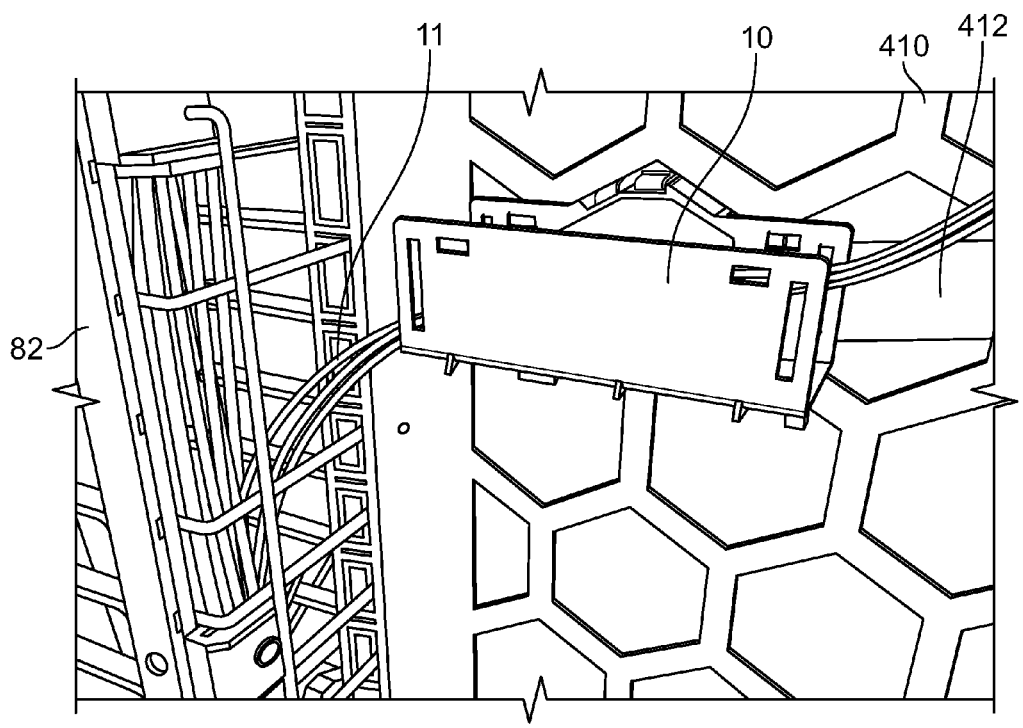
FIG. 16 is a front perspective view of the cable trough of FIG. 1 mounted with respect to an exemplary rack.

In exemplary embodiments and as shown in FIGS. 1, 5-6 and 12, each attachment member 22 includes an extending portion 26 and a securing portion 28. Securing portion 28 is configured and dimensioned to releasably secure/mount or snap-fit with respect to an edge 420 of aperture 412 for securement purposes of cable trough 10 (FIG. 16).

Figure 8:
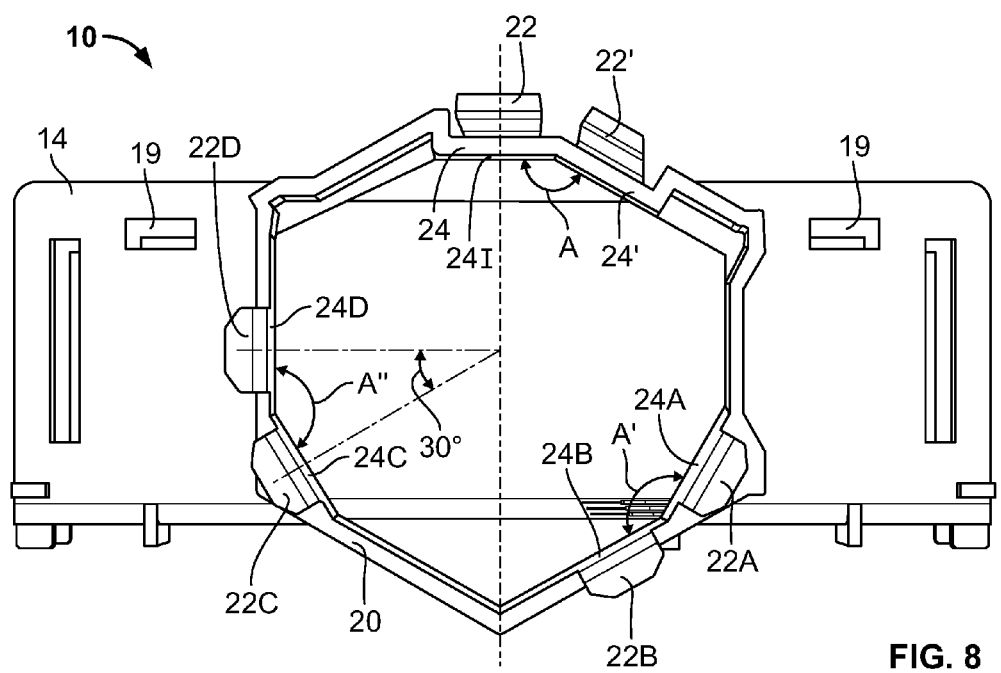
FIG. 8 is a rear view of the cable trough of FIG. 1.

As shown in FIG. 8, the plurality of flange walls 24 defines a substantially hexagonal shape of attachment flange 20. It is noted that flange walls 24 can define other shapes/geometries of flange 20 (e.g., polygonal shapes).

Figure 9:
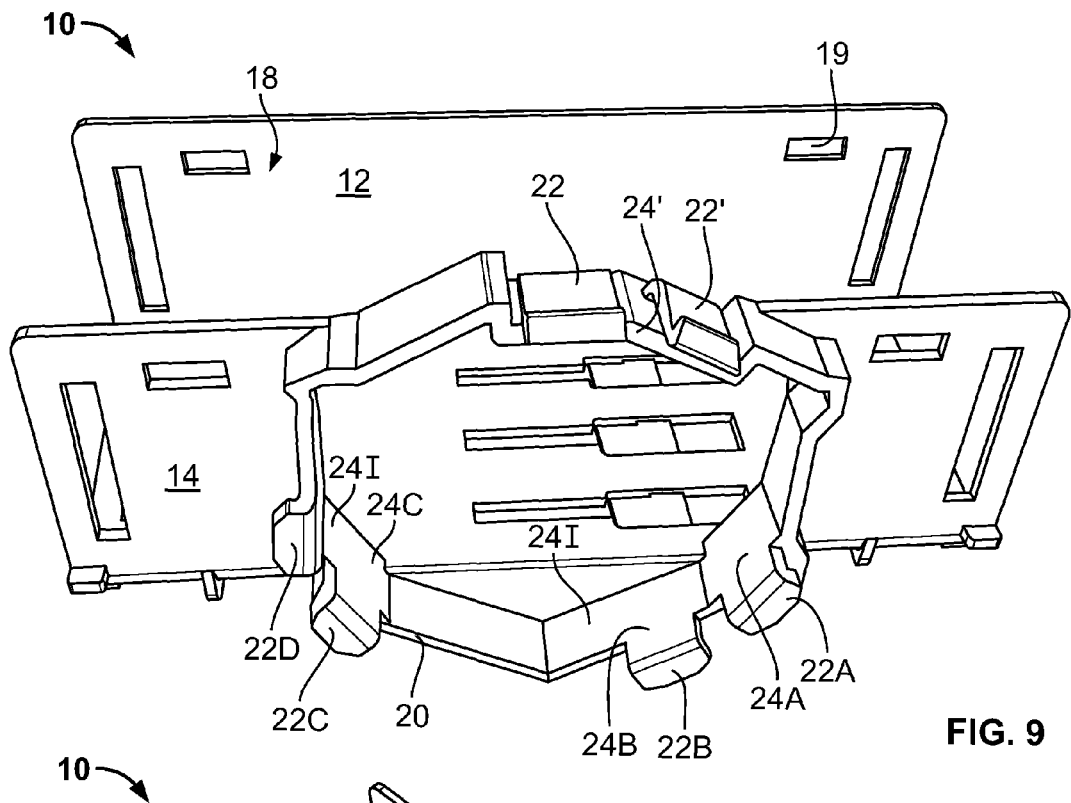
FIG. 9 is a rear perspective view of the cable trough of FIG. 1.
Figure 11:
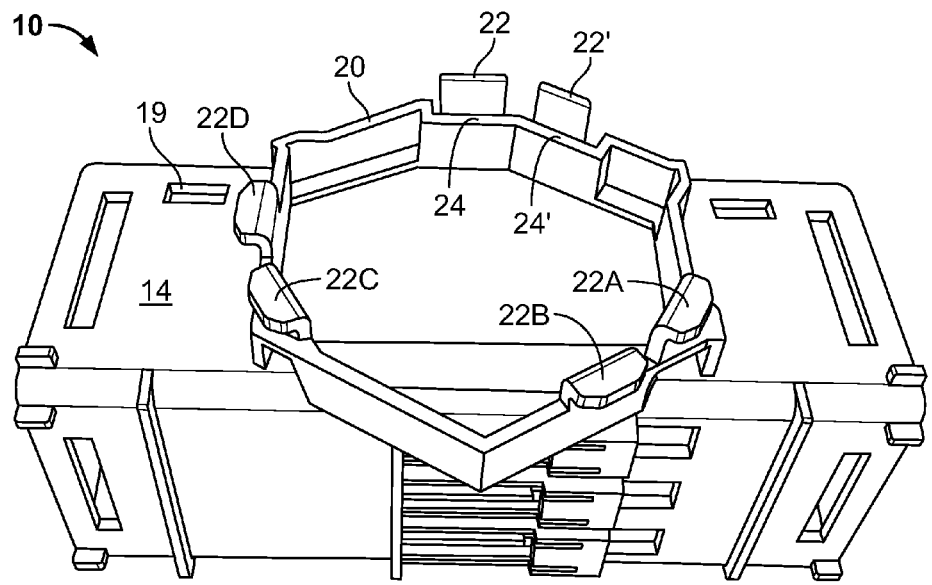
FIG. 11 is a bottom perspective view of the cable trough of FIG. 1.
Figure 12:
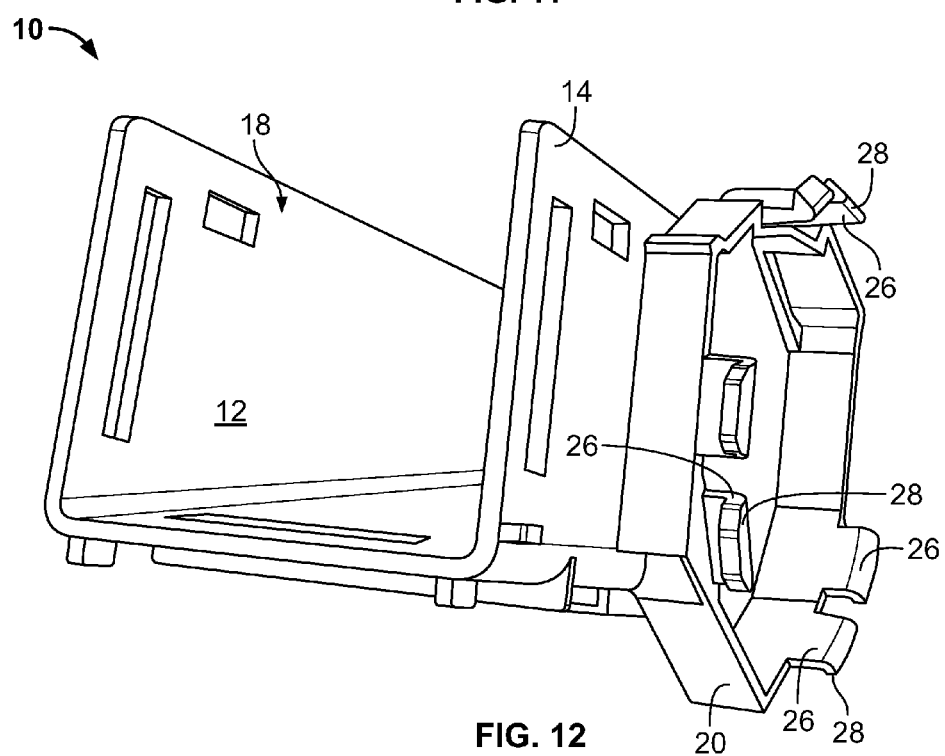
FIG. 12 is a side perspective view of the cable trough of FIG. 1.
Figure 13:
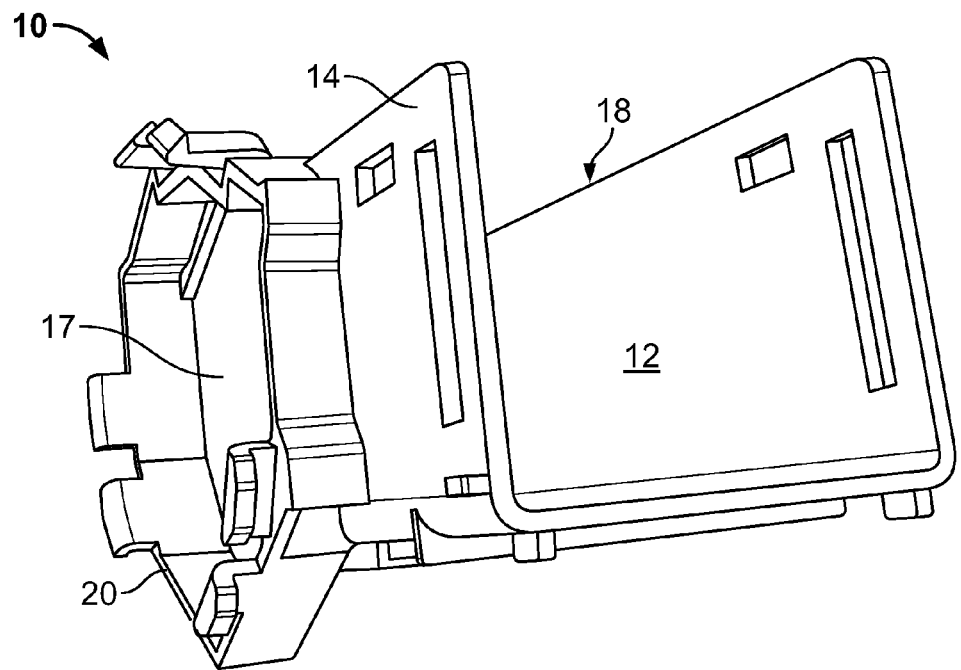
FIG. 13 is a side perspective view of the cable trough of FIG. 1.
Figure 14:
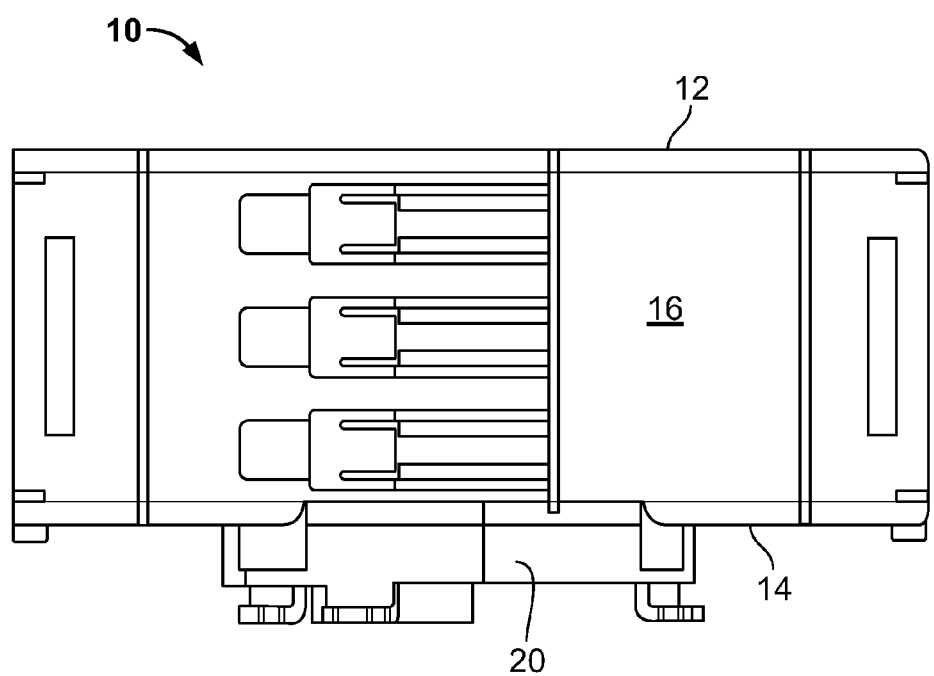
FIG. 14 is a bottom view of the cable trough of FIG. 1.
Figure 15:
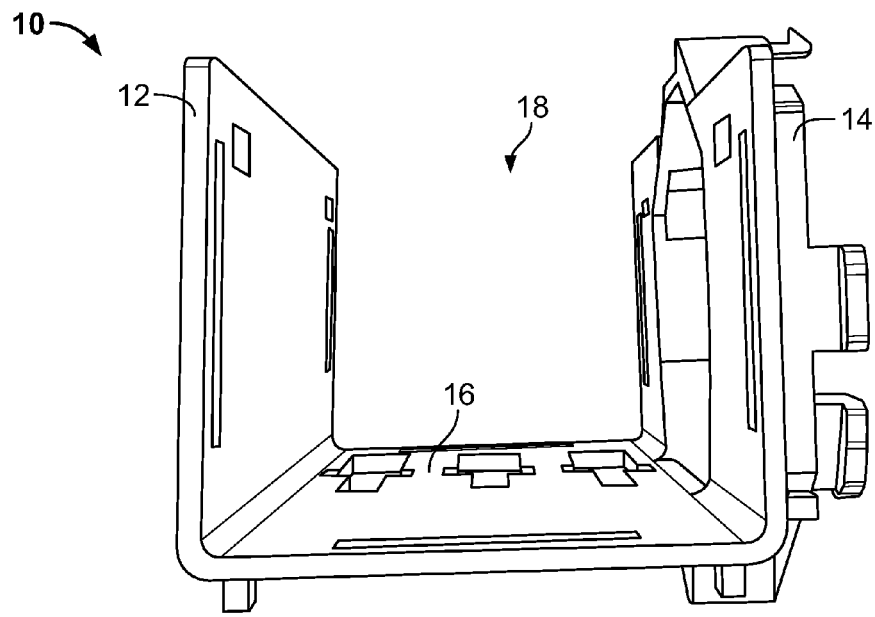
FIG. 15 is a side view of the cable trough of FIG. 1.

In exemplary embodiments and as shown in FIGS. 8, 9 and 11, flange 20 includes six attachment members 22, 22', 22A, 22B, 22C and 22D. Flange 20 can include any suitable number of attachment members 22, 22', etc.

As shown in FIGS. 8, 9 and 11, attachment member 22 extends from flange wall 24, attachment member 22' extends from flange wall 24', attachment member 22A extends from flange wall 24A, attachment member 22B extends from flange wall 24B, attachment member 22C extends from flange wall 24C, and attachment member 22D extends from flange wall 24D.

Flange walls 24 and 24' are proximal (e.g., adjacent) to one another, and at least one surface (e.g., inner surface 241) of each wall 24, 24' is angled at a pre-determined angle A (e.g., about 150°) relative to one another (FIG. 8). It is noted that at least one surface of walls 24, 24' can be angled at any suitable angle relative to one another.

Likewise, attachment members 22, 22' are proximal (e.g., adjacent) to one another, and each attachment member 22, 22' is angled at a pre-determined angle (e.g., about 150°) relative to one another. It is noted that attachment members 22, 22' are typically angled relative to one another at about the same angle (e.g., about 150°) that the walls 24, 24' are angled relative to one another. As such, exemplary walls 24, 24' are angled at about 150° relative to one another, and exemplary attachment members 22, 22' are angled at about 150° relative to one another. It is noted, however, that walls 24, 24' and/or members 22, 22' can be angled at other angles relative to one another (e.g., from about 90° to about 175°).

Flange walls 24A and 24B are proximal (e.g., adjacent) to one another, and at least one surface (e.g., inner surface 241) of each wall 24A, 24B is angled at a pre-determined angle A' (e.g., about 150°) relative to one another (FIG. 8). At least one surface of walls 24A, 24B can be angled at any suitable angle relative to one another.

Likewise, attachment members 22A, 22B are proximal (e.g., adjacent) to one another, and each attachment member 22A, 22B is angled at a pre-determined angle (e.g., about 150°) relative to one another. Attachment members 22A, 22B are typically angled relative to one another at about the same angle (e.g., about 150°) that the walls 24A, 24B are angled relative to one another. Exemplary walls 24A, 24B are angled at about 150° relative to one another, and exemplary attachment members 22A, 22B are angled at about 150° relative to one another. Walls 24A, 24B and/or members 22A, 22B can be angled at other angles relative to one another (e.g., from about 90° to about 175°).

Flange walls 24C and 24D are proximal (e.g., adjacent) to one another, and at least one surface (e.g., inner surface 241) of each wall 24C, 24D is angled at a pre-determined angle A" (e.g., about 150°) relative to one another. At least one surface of walls 24C, 24D can be angled at any suitable angle relative to one another.

Likewise, attachment members 22C, 22D are proximal (e.g., adjacent) to one another, and each attachment member 22C, 22D is angled at a pre-determined angle (e.g., about 150°) relative to one another. Attachment members 22C, 22D are typically angled relative to one another at about the same angle (e.g., about 150°) that the walls 24C, 24D are angled relative to one another. Exemplary walls 24C, 24D are angled at about 150° relative to one another, and exemplary attachment members 22C, 22D are angled at about 150° relative to one another. Walls 24C, 24D and/or members 22C, 22D can be angled at other angles relative to one another (e.g., from about 90° to about 175°).

As noted above, attachment flange 20 and attachment members 22, 22', etc. are advantageously configured and dimensioned to releasably mount with respect to a user-selected aperture 412 of rack 400 (e.g., a user can mount cable trough 10 to one of a variety of different apertures 412 for differing mounting locations of cable trough 10 to rack 400—FIGS. 16-21). Moreover, the attachment flange 20 and attachment members 22, 22', etc. allow the cable trough 10 to be releasably mounted at various angled positions relative to the rack 400 (and relative to aperture 412), as selected by a user (FIGS. 16-21). As discussed below, cable trough 10 can be mounted with respect to the exterior surface (FIGS. 16-18 and 20), or to the interior surface (FIGS. 19 and 21) of side panel 410 of rack 400.

It is also noted that a plurality of cable troughs 10 can be mounted with respect to side panel 410 of rack 400, with each cable trough 10 mounted at differing mounting locations on rack 400 (e.g., to different apertures 412), and with each cable trough 10 mounted at the same or different angled positions relative to the rack 400 (as selected by the user) (FIGS. 17-21).

Figure 17:
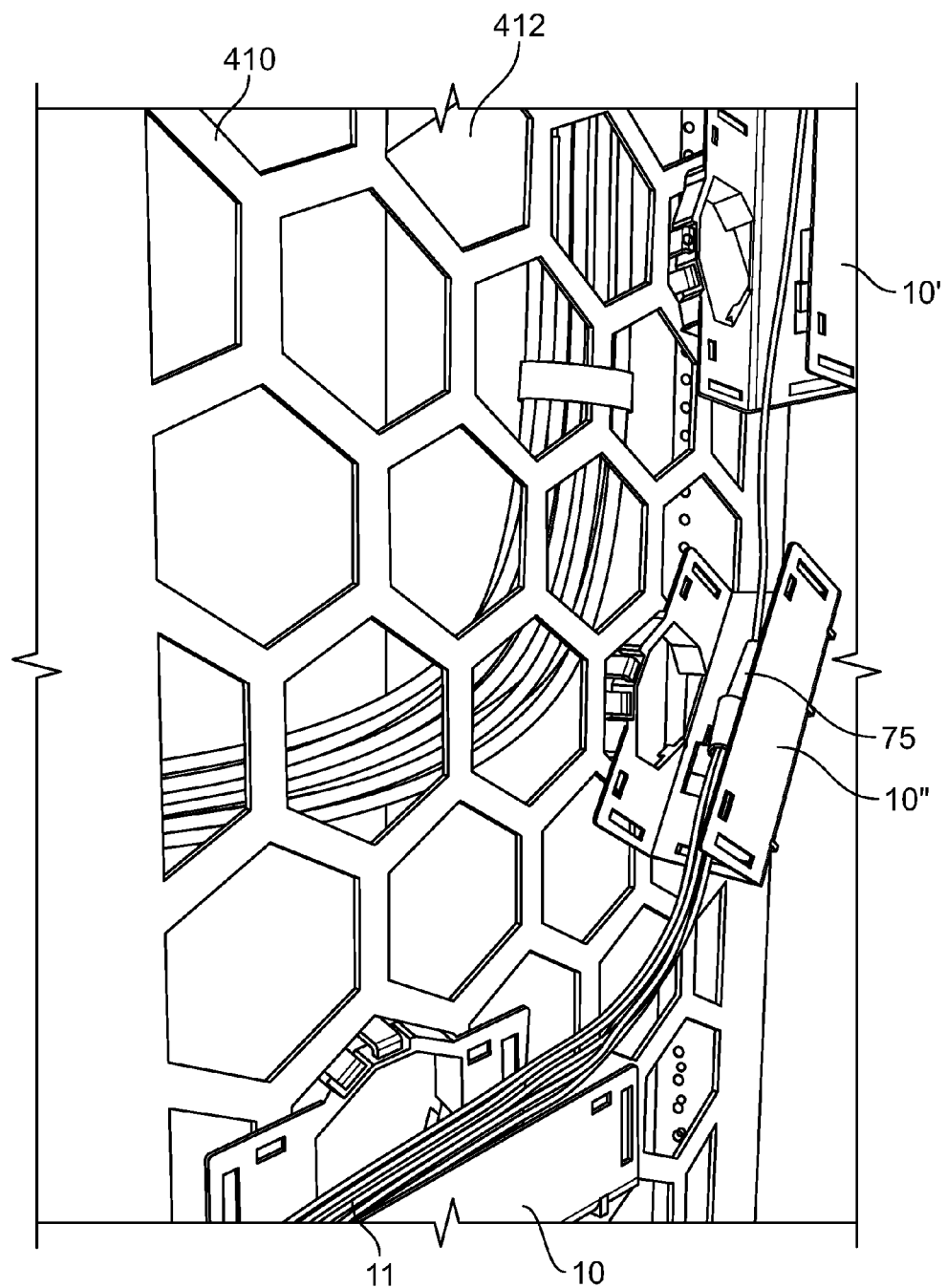
FIGS. 17-21 are side perspective views of exemplary cable troughs mounted with respect to exemplary racks.
Figure 18:
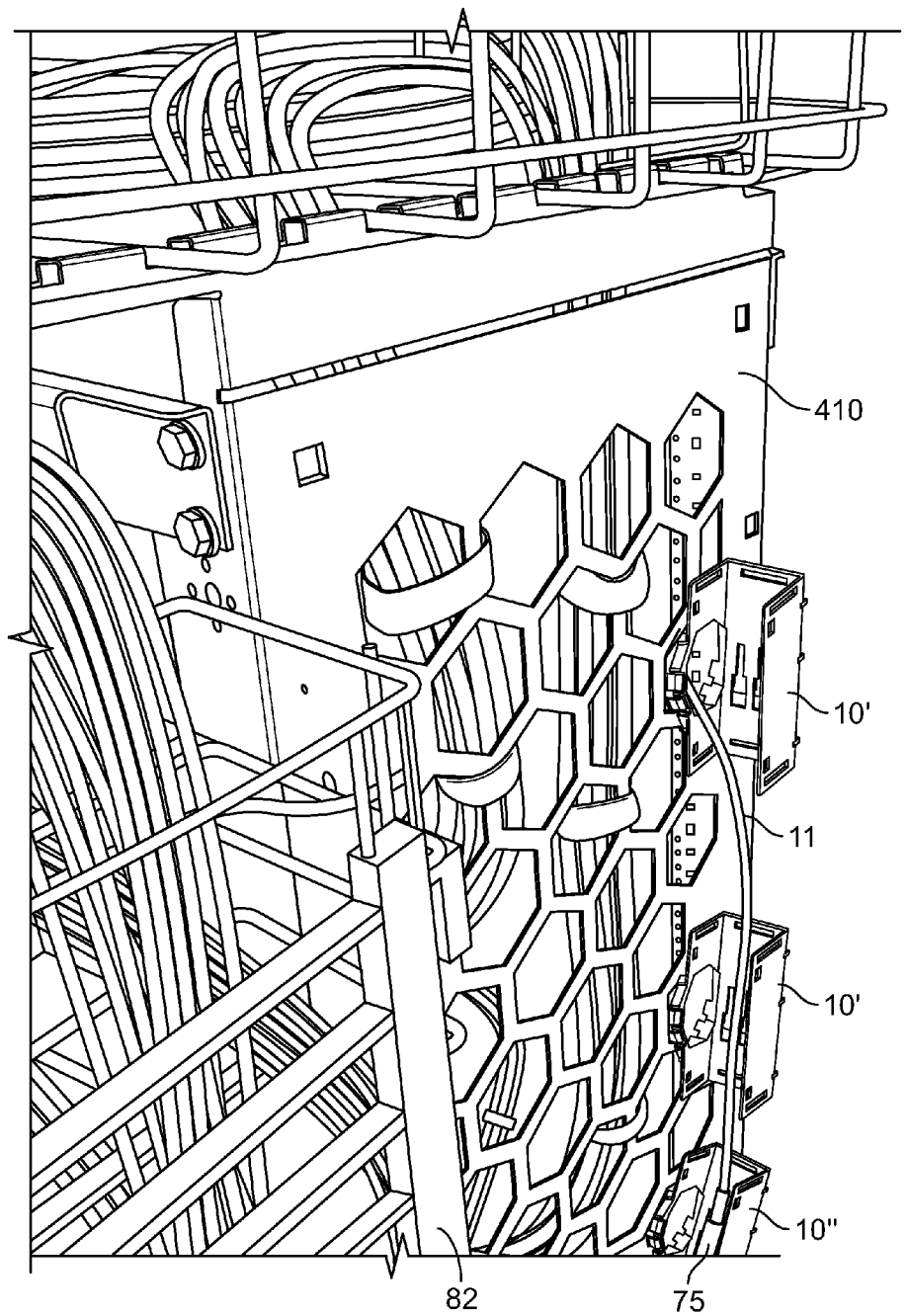

In certain embodiments, one or more cable troughs 10 are mounted with respect to side panel 410 of rack 400, and media cables 11 from a cable/wire manager assembly 82 (e.g., a vertical cable manager assembly 82 positioned between two adjacent/proximal racks 400) travel from the cable/wire manager assembly 82 to the one or more cable troughs 10 for cable management purposes (e.g., to advantageously provide support for media cables 11 during their travel from the front to the rear of the racks 400, and/or between adjacent racks 400) (FIGS. 16-18 and 20). It is noted that media cables 11 can pass through hole 17 of rear wall 14 for cable management/support purposes (FIG. 18). Additionally, it is noted that mounted trough 10 to rack 400 does not impede the flow of air (e.g., cooling or exhaust air) through side panels 410 of rack (e.g., via air flowing thorough hole 17 of rear wall 14). It certain embodiments, the shape of hole 17 substantially matches up with and aligns with aperture 412 when trough is mounted to that particular aperture 412.

In certain embodiments, when cable trough 10 is mounted with respect to side panel 410 at a first angled position relative to side panel 410 as shown in FIGS. 16-17 (e.g., a substantially horizontal position of trough 10 relative to the ground), at least a portion of the securing portions 28 of attachment members 22', 22B and 22D are engaged with and/or releasably mounted with respect to a respective edge 420 of aperture 410. In some embodiments and in this first angled position relative to side panel 410 as shown in FIGS. 16-17, the securing portions 28 of attachments members 22, 22A and 22C are unable to engage with and/or releasably mount with respect to a respective edge 420 of aperture 410.

However, it is to be noted that in this first angled position of FIGS. 16-17, the securing portions 28 of attachments members 22, 22A and/or 22C could be configured and dimensioned to be engaged with and/or releasably mounted with respect to a respective edge 420 of aperture 410, along with the securing portions 28 of attachment members 22', 22B and 22D (e.g., depending on the pre-determined angle between the respective attachment members 22, 22', etc.).

In some embodiments, when cable trough 10' is mounted with respect to side panel 410 at a second angled position relative to side panel 410 as shown in FIG. 17 (e.g., a substantially vertical position of trough 10' relative to the ground), at least a portion of the securing portions 28 of attachment members 22, 22A and 22C are engaged with and/or releasably mounted with respect to a respective edge 420 of aperture 410. In certain embodiments and in this second angled position relative to side panel 410 as shown in FIG. 17, the securing portions 28 of attachments members 22', 22B and 22D are unable to engage with and/or releasably mount with respect to a respective edge 420 of aperture 410.

However, it is to be noted that in this second angled position of FIG. 17, the securing portions 28 of attachments members 22', 22B and/or 22D could be configured and dimensioned to be engaged with and/or releasably mounted with respect to a respective edge 420 of aperture 410, along with the securing portions 28 of attachment members 22, 22A and 22C (e.g., depending on the pre-determined angle between the respective attachment members 22, 22', etc.).

In certain embodiments, when cable trough 10" is mounted with respect to side panel 410 at a third angled position relative to side panel 410 as shown in FIG. 17 (e.g., an angled position of trough 10" relative to the ground), at least a portion of the securing portions 28 of attachment members 22', 22B and 22D are engaged with and/or releasably mounted with respect to a respective edge 420 of aperture 410. In some embodiments and in this first angled position relative to side panel 410 as shown in FIG. 17, the securing portions 28 of attachments members 22, 22A and 22C are unable to engage with and/or releasably mount with respect to a respective edge 420 of aperture 410.

However, it is to be noted that in this third angled position of FIG. 17, the securing portions 28 of attachments members 22, 22A and/or 22C could be configured and dimensioned to be engaged with and/or releasably mounted with respect to a respective edge 420 of aperture 410, along with the securing portions 28 of attachment members 22', 22B and 22D (e.g., depending on the pre-determined angle between the respective attachment members 22, 22', etc.).

As such, exemplary troughs 10, 10' and/or 10" are configured and dimensioned to be releasably mounted with respect to an exemplary aperture 412 (e.g., a substantially hexagonal aperture 412) of side panel 410 in at least 12 different angled positions relative to side panel 410 and to aperture 412 (e.g., when attachment members 22 and 22' are angled at an angle of about 150° relative to one another, and when attachment members 22A and 22B are angled at an angle of about 150° relative to one another, and when attachment members 22C and 22D are angled at an angle of about 150° relative to one another). Stated another way, a user can move and then mount exemplary troughs 10, 10' and/or 10" in about 30° angle increments (FIG. 8) around hexagonal aperture 412 (e.g., a user can move and mount troughs 10 of the present disclosure 360° around hexagonal aperture 412 in 30° increments).

Again, depending on the pre-determined angle between the respective attachment members 22, 22', etc., and depending on the shape/geometry (e.g., polygonal shape) of apertures 412, it is noted that troughs 10, 10' and/or 10" could be mounted with respect to other such apertures 412 in a variety of different angled positions relative to rack 400, with a variety of combinations of attachment members 22, 22' etc. mounting to a respective edge 420 at each angled mounting position of troughs 10, 10' and/or 10".

Figure 10:
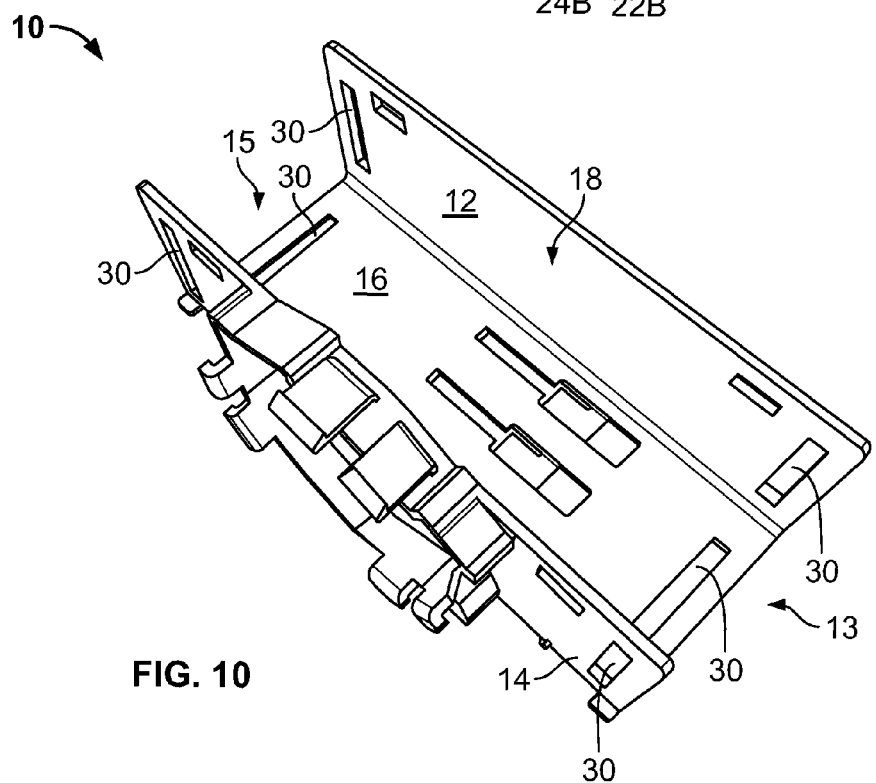
FIG. 10 is a top perspective view of the cable trough of FIG. 1.
Figure 19:
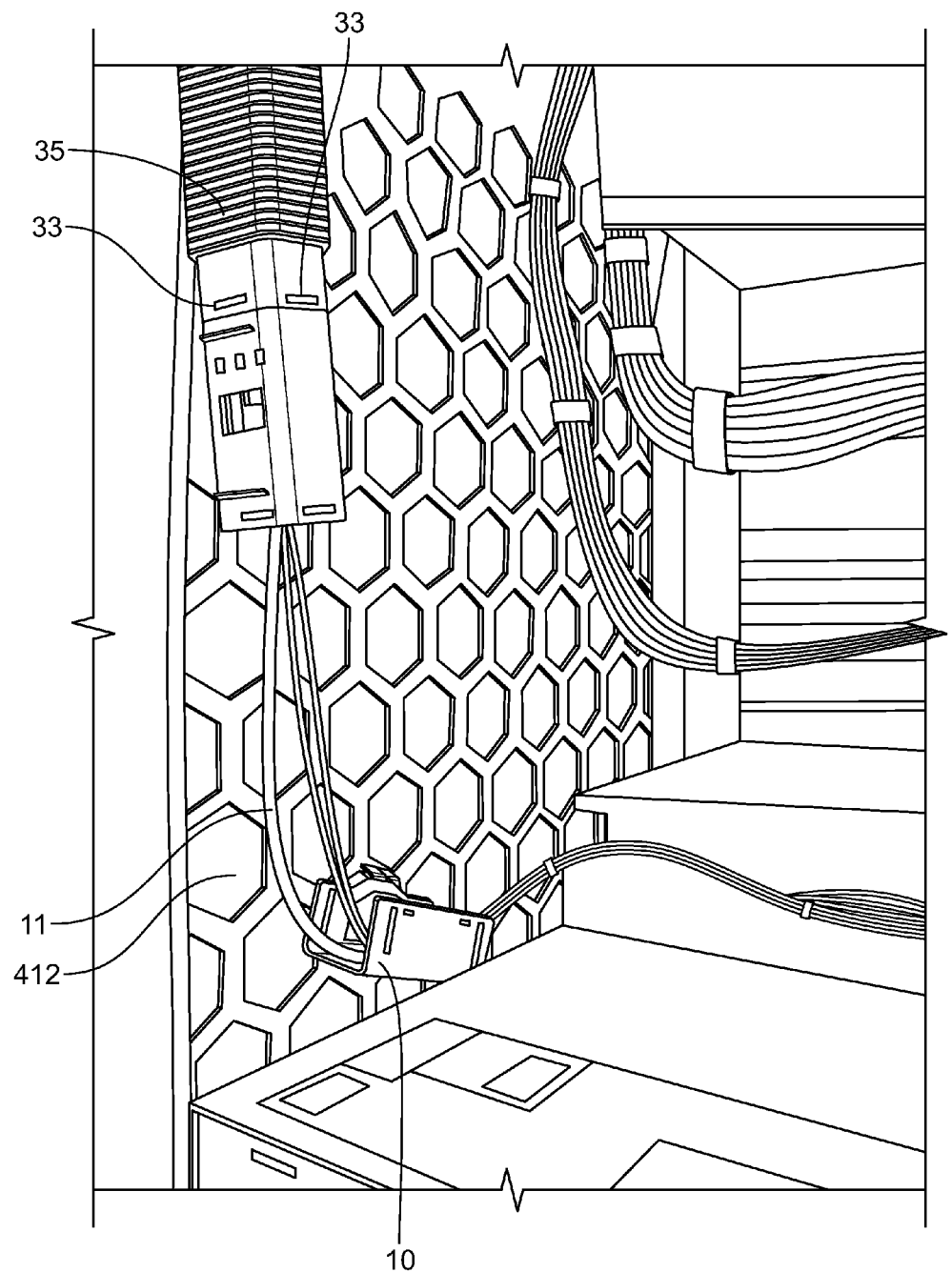
Figure 20:
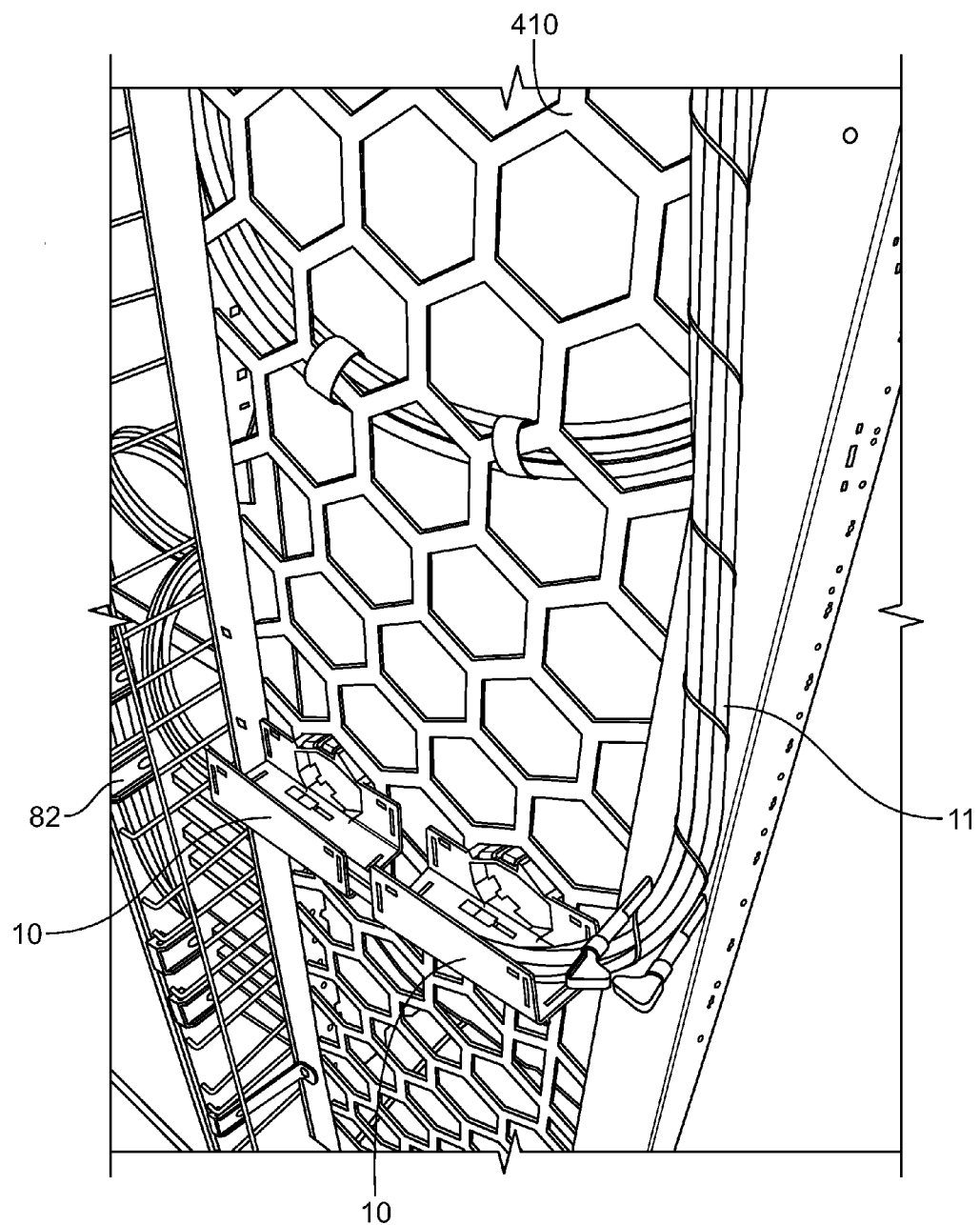
Figure 21:
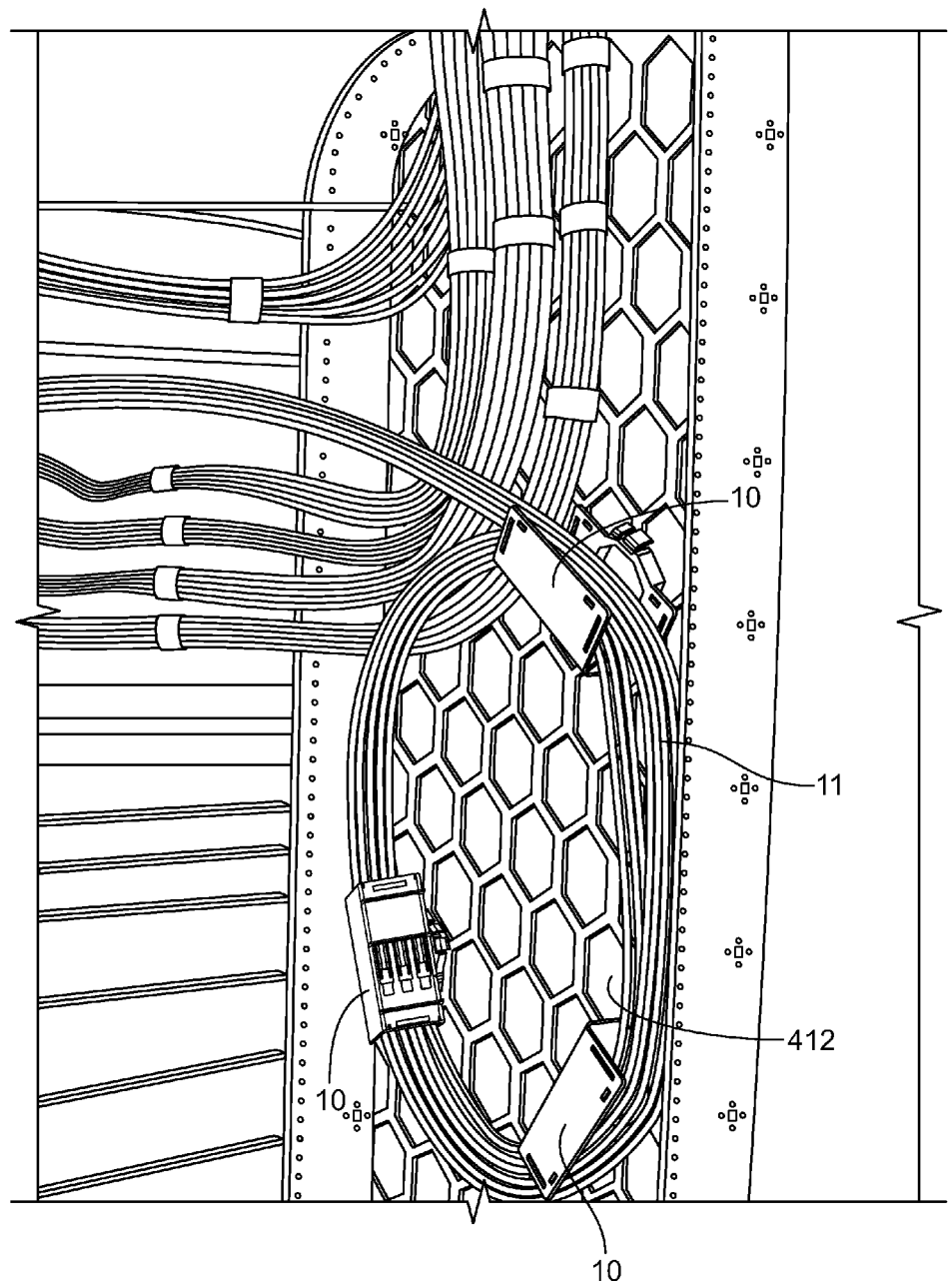

In exemplary embodiments and as shown in FIGS. 1, 10 and 19, the front, rear and/or bottom walls 12, 14, 16 can include one or more mounting slots 30 (e.g., at first and/or second ends 13, 15 of trough 10). In general, each mounting slot 30 is configured and dimensioned to releasably mate with a mounting member 33 of a cable raceway 35 or the like (e.g., to a cable raceway connector 35 or the like), for cable management purposes.

Figure 6:
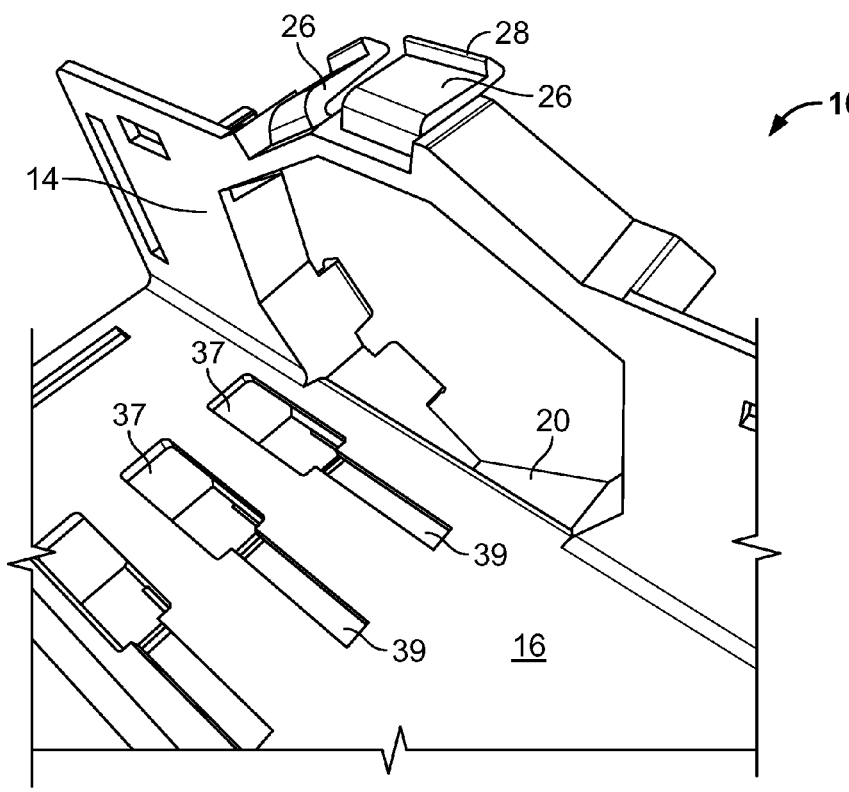
FIG. 6 is a partial side perspective view of the cable trough of FIG. 1.
Figure 7:
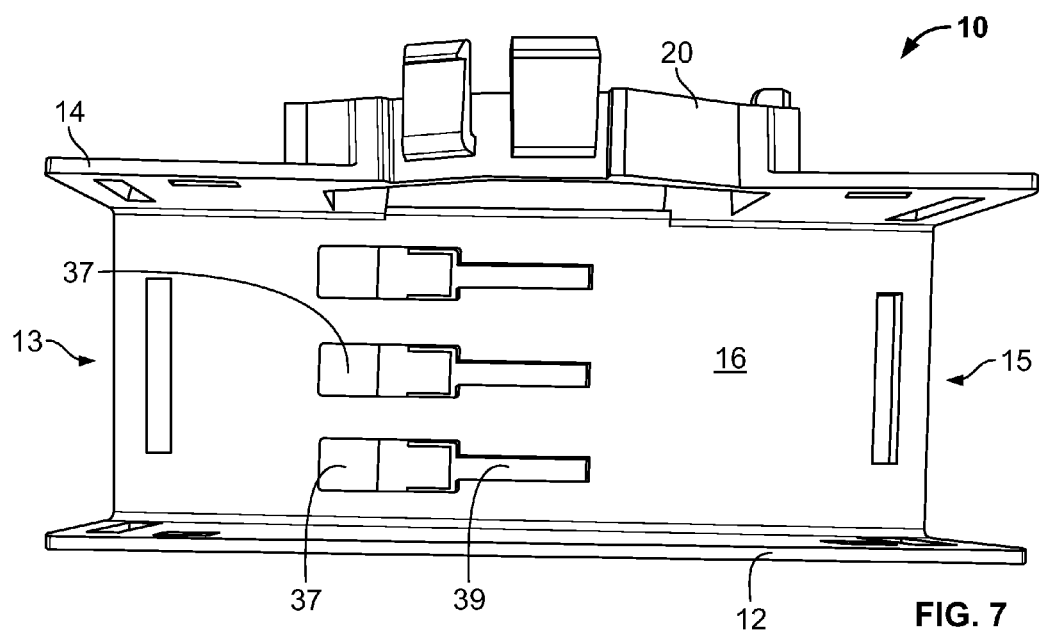
FIG. 7 is a top view of the cable trough of FIG. 1.

As shown in FIGS. 17-18, one or more breakout assemblies 75 (e.g., fiber optic breakout assemblies 75) can be mounted with respect to cable trough 10 (e.g., to bottom wall 16 of cable trough 10), as described and disclosed in U.S. Pat. No. 8,731,364 noted above. More particularly and as shown in FIGS. 6-7, bottom wall 16 can include one or more mating features 37, 39 (e.g., slot portions 37, 39), with each mating feature 37, 39 configured to releasably secure a breakout assembly 75 (FIGS. 17-18) thereto as described and disclosed in U.S. Pat. No. 8,731,364. Cable trough 10 (e.g., bottom wall 16, front wall 12 and/or rear wall 14) can include any number of mating features 37, 39 for breakout assembly mounting purposes (e.g., one, two, three, four, a plurality, etc.).

Moreover, cable trough 10 (e.g., bottom wall 16, front wall 12 and/or rear wall 14) can include one or more mounting features (e.g., similar to 37, 39), with each mounting feature configured and dimensioned to allow a cable strain relief member or cable management element or the like to be mounted with respect to cable trough 10.

Although the systems and methods of the present disclosure have been described with reference to exemplary embodiments thereof, the present disclosure is not limited to such exemplary embodiments and/or implementations. Rather, the systems and methods of the present disclosure are susceptible to many implementations and applications, as will be readily apparent to persons skilled in the art from the disclosure hereof. The present disclosure expressly encompasses such modifications, enhancements and/or variations of the disclosed embodiments. Since many changes could be made in the above construction and many widely different embodiments of this disclosure could be made without departing from the scope thereof, it is intended that all matter contained in the drawings and specification shall be interpreted as illustrative and not in a limiting sense. Additional modifications, changes, and substitutions are intended in the foregoing disclosure. Accordingly, it is appropriate that the appended claims be construed broadly and in a manner consistent with the scope of the disclosure.

What is claimed is:
1. A cable trough comprising:
a bottom wall;
a front wall extending from the bottom wall and a rear wall extending from the bottom wall, the front, rear and bottom walls defining a channel configured to support and at least partially house media cables;
an attachment flange extending from the rear wall, the attachment flange including: (i) a first attachment member extending from a first flange wall of the attachment flange, and (ii) a second attachment member extending from a second flange wall of the attachment flange;
wherein the first and second flange walls are proximal to one another and angled at a first pre-determined angle relative to one another;
wherein the first and second attachment members are proximal to one another and angled at the first pre-determined angle relative to one another;
wherein the first attachment member is configured to releasably mount with respect to an edge of an aperture of a supporting structure when the attachment flange is in a first angled position relative to the supporting structure;
wherein the second attachment member is configured to releasably mount with respect to the edge of the aperture of the supporting structure when the attachment flange is in a second angled position relative to the supporting structure; and
wherein the rear wall includes a hole therethrough, the hole configured to substantially match up with and align with the aperture when the attachment flange is in the first or second angled position relative to the supporting structure.

2. The cable trough of claim 1, wherein the second attachment member is unable to mount to the edge of the aperture of the supporting structure when the attachment flange is in the first angled position relative to the supporting structure; and
  wherein the first attachment member is unable to mount to the edge of the aperture of the supporting structure when the attachment flange is in the second angled position relative to the supporting structure.

3. The cable trough of claim 1, wherein the channel is substantially U-shaped.

4. The cable trough of claim 1, wherein the supporting structure is a rack.

5. The cable trough of claim 1 further comprising a third attachment member extending from a third flange wall of the attachment flange, and a fourth attachment member extending from a fourth flange wall of the attachment flange; and
  wherein the third and fourth flange walls are proximal to one another and angled at a second pre-determined angle relative to one another;
  wherein the third and fourth attachment members are proximal to one another and angled at the second pre-determined angle relative to one another;
  wherein the first and third attachment members are configured to releasably mount with respect to the edge of the aperture of the supporting structure when the attachment flange is in the first angled position relative to the supporting structure; and
  wherein the second and fourth attachment members are configured to releasably mount with respect to the edge of the aperture of the supporting structure when the attachment flange is in the second angled position relative to the supporting structure.

6. The cable trough of claim 5, wherein the second and fourth attachment members are unable to mount to the edge of the aperture of the supporting structure when the attachment flange is in the first angled position relative to the supporting structure; and
  wherein the first and third attachment members are unable to mount to the edge of the aperture of the supporting structure when the attachment flange is in the second angled position relative to the supporting structure.

7. The cable trough of claim 5 further comprising a fifth attachment member extending from a fifth flange wall of the attachment flange, and a six attachment member extending from a sixth flange wall of the attachment flange; and
  wherein the fifth and sixth flange walls are proximal to one another and angled at a third pre-determined angle relative to one another;
  wherein the fifth and sixth attachment members are proximal to one another and angled at the third pre-determined angle relative to one another;
  wherein the first, third and fifth attachment members are configured to releasably mount with respect to the edge of the aperture of the supporting structure when the attachment flange is in the first angled position relative to the supporting structure; and
  wherein the second, fourth and sixth attachment members are configured to releasably mount with respect to the edge of the aperture of the supporting structure when the attachment flange is in the second angled position relative to the supporting structure.

8. The cable trough of claim 7, wherein the second, fourth and sixth attachment members are unable to mount to the edge of the aperture of the supporting structure when the attachment flange is in the first angled position relative to the supporting structure; and
  wherein the first, third and fifth attachment members are unable to mount to the edge of the aperture of the supporting structure when the attachment flange is in the second angled position relative to the supporting structure.

9. The cable trough of claim 1, wherein the first pre-determined angle is about 150°.

10. The cable trough of claim 7, wherein the first, second and third pre-determined angles are each about 150°.

11. The cable trough of claim 1, wherein the aperture of the supporting structure has a substantially polygonal shape.

12. The cable trough of claim 1, wherein the aperture of the supporting structure has a substantially hexagonal shape.

13. The cable trough of claim 1, wherein the first and second attachment members each include an extending portion and a securing portion.

14. The cable trough of claim 1, wherein the front, rear and bottom walls each include one or more mounting slots, each mounting slot configured to mount with respect to a cable raceway.

15. The cable trough of claim 1, wherein the front and rear walls are substantially parallel to one another.

16. The cable trough of claim 1, wherein the first pre-determined angle is from about 90° to about 175°.

17. The cable trough of claim 7, wherein the first, second and third pre-determined angles are each from about 90° to about 175°.

18. A cable trough comprising:
  a bottom wall;
  a front wall extending from the bottom wall and a rear wall extending from the bottom wall, the front, rear and bottom walls defining a substantially U-shaped channel configured to support and at least partially house media cables;
  an attachment flange extending from the rear wall, the attachment flange including: (i) a first attachment member extending from a first flange wall of the attachment flange, and (ii) a second attachment member extending from a second flange wall of the attachment flange;
  wherein the first and second flange walls are adjacent to one another and angled at a pre-determined angle relative to one another;
  wherein the first and second attachment members are adjacent to one another and angled at the pre-determined angle relative to one another;
  wherein the first attachment member is configured to releasably mount with respect to an edge of an aperture of a rack when the attachment flange is in a first angled position relative to the rack;
  wherein the second attachment member is configured to releasably mount with respect to the edge of the aperture of the rack when the attachment flange is in a second angled position relative to the rack;
  wherein the second attachment member is unable to mount to the edge of the aperture of the rack when the attachment flange is in the first angled position relative to the rack;
  wherein the first attachment member is unable to mount to the edge of the aperture of the rack when the attachment flange is in the second angled position relative to the rack; and
  wherein the first pre-determined angle is from about 90° to about 175°.

19. A cable trough system comprising:
  a first cable trough having: (i) a bottom wall, a front wall extending from the bottom wall, and a rear wall extending from the bottom wall, with the front, rear and bottom walls defining a channel configured to support and at least partially house media cables, and (ii) means for releasably mounting the first cable trough to a first polygonal aperture of a supporting structure at different angled positions relative to the supporting structure.

20. The cable trough system of claim 19 further comprising:
- a supporting structure; and
- a second cable trough having: (i) a bottom wall, a front wall extending from the bottom wall, and a rear wall extending from the bottom wall, with the front, rear and bottom walls defining a channel configured to support and at least partially house media cables, and (ii) means for releasably mounting the second cable trough to a second polygonal aperture of the supporting structure at different angled positions relative to the supporting structure.

21. The cable trough system of claim 20, wherein the supporting structure includes a side panel, the side panel including the first and second polygonal apertures;
- wherein the first cable trough is mounted with respect to the first polygonal aperture at a first angled position relative to the side panel;
- wherein the second cable trough is mounted with respect to the second polygonal aperture at a second angled position relative to the side panel.

22. The cable trough system of claim 21, wherein the first and second angled positions are angled at different angles relative to the side panel.

\* \* \* \* \*